United States Patent
Hartwell

(10) Patent No.: US 7,115,505 B2
(45) Date of Patent: Oct. 3, 2006

(54) METHODS FOR ELECTRICALLY ISOLATING PORTIONS OF WAFERS

(75) Inventor: Peter George Hartwell, Sunnyvale, CA (US)

(73) Assignee: Hewlett-Packard Development Company, L.P., Houston, TX (US)

(\*) Notice: Subject to any disclaimer, the term of this patent is extended or adjusted under 35 U.S.C. 154(b) by 0 days.

(21) Appl. No.: 10/822,413

(22) Filed: Apr. 12, 2004

(65) Prior Publication Data

US 2004/0192029 A1 Sep. 30, 2004

Related U.S. Application Data

(62) Division of application No. 10/035,792, filed on Oct. 18, 2001, now Pat. No. 6,750,516.

(51) Int. Cl.
*H01L 21/44* (2006.01)

(52) U.S. Cl. .................................. 438/667; 438/424

(58) Field of Classification Search ............ 438/667, 438/353, 359, 400, 421, 411, 424, 437, 453, 438/597, 598, 619, 637, 638, 642, 643, 652, 438/653, 668, 672, 675, 620
See application file for complete search history.

(56) References Cited

U.S. PATENT DOCUMENTS 3,663,308 A * 5/1972 Davey ................... 438/407
3,769,562 A 10/1973 Bean
5,998,292 A 12/1999 Black et al.
6,395,630 B1 * 5/2002 Ahn et al. .............. 438/667
2003/0207566 A1 * 11/2003 Forbes et al. .......... 438/667

FOREIGN PATENT DOCUMENTS

WO WO 01/65598 9/2001

OTHER PUBLICATIONS

Park, T., et al., "Double Trench Isolation (DTI): A Novel Isolation Technology for Deep-Submicron Silicon Devices," Advanced Technology Center, Samsum Electronics, Co. Ltd.

\* cited by examiner

*Primary Examiner*—Michael Lebentritt
*Assistant Examiner*—Stanetta Isaac

(57) ABSTRACT

Systems for electrically isolating portions of wafers are provided. A representative system includes a first wafer and a first conductor formed at least partially through the first wafer. A first conductor insulating layer is formed at least partially through the first wafer. The first conductor insulating layer engages the first conductor and is disposed between the first conductor and material of the first wafer. A first outer insulating layer also is provided that is formed at least partially through the first wafer. The first outer insulating layer is spaced from the first conductor insulating layer. Both the first conductor insulating layer and the first outer insulating layer are formed of dielectric material. Methods also are provided.

14 Claims, 6 Drawing Sheets

METHODS FOR ELECTRICALLY ISOLATING PORTIONS OF WAFERS

CROSS REFERENCE TO RELATED APPLICATIONS

This application is a divisional application, which is based on and claims priority to U. S. Utility patent application Ser. No. 10/035,792, filed on Oct. 18, 2001, now U.S. Pat. No. 6,750,516, and which is incorporated herein in its entirety.

BACKGROUND OF THE INVENTION

1. Field of the Invention

The present invention generally relates to semiconductors. More specifically, the invention relates to systems and methods pertaining to semiconductors that incorporate one or more electrically isolated portions.

2. Description of the Related Art

Semiconductor wafers oftentimes are arranged in an overlying relationship with each other and are bonded together to form a wafer stack. In order to facilitate communication of processing of one wafer of such a wafer stack with processing of another wafer, various interconnecting structures may be used. For example, wires can be used to interconnect components of the various wafers so that the components can electrically communicate with each other. In other wafer stacks, conductor vias can be used. A representative example of such a via is depicted in FIG. 1.

As shown in FIG. 1, wafer 100 includes a via structure 102 that is formed through the material of the wafer. Via structure 102 includes an insulator ring 104 that is formed about a conductor 106. Via structure 102 permits the propagation of low voltage signals from one side of wafer 100 to the other side. More specifically, such a signal can be propagated from one side of the wafer to the other through conductor 106. Unfortunately, via structure 102 tends to breakdown or short when relatively large potential differences exist between the conductor 106 and the substrate 108. Thus, it can be appreciated that there is a need for improved systems and methods that address these and/or other shortcomings of the prior art.

SUMMARY OF THE INVENTION

Briefly described, the present invention relates to semiconductors that incorporate one or more electrically isolated portions. In this regard, embodiments of the invention may be construed as providing methods for electrically isolating portions of wafers. A representative method includes the steps of: providing a first wafer, forming a first conductor at least partially through the first wafer, disposing first dielectric material between the first conductor and material of the first wafer, and at least partially surrounding the first conductor and the first dielectric material with second dielectric material. Preferably, the second dielectric material is spaced from the first dielectric material so that a first portion of the material of the first wafer is arranged between the first dielectric material and the second dielectric material and a second portion of the material of the first wafer is arranged outside an outer periphery of the second dielectric material.

Embodiments of the invention also may be construed as providing systems for electrically isolating portions of wafers. In this regard, a representative embodiment includes a first wafer and a first conductor formed at least partially through the first wafer. A first conductor insulating layer is formed at least partially through the first wafer. The first conductor insulating layer engages the first conductor and is disposed between the first conductor and material of the first wafer. A first outer insulating layer also is provided that is formed at least partially through the first wafer. The first outer insulating layer is spaced from the first conductor insulating layer Both the first conductor insulating layer and the first outer insulating layer are formed of dielectric material.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION

As described in greater detail hereinafter, the present invention relates to electrically isolating portions of a wafer. More specifically, embodiments of the invention involve the use of via structures that are electrically isolated from the substrate that surrounds the via structures. In this manner, the via structures can be adapted to facilitate communication of signals, e.g., power signal and/or data signals, through at least a portion of a wafer while reducing the potential of electrical breakdown of the substrate in the vicinity of the via structures.

Figure 1:
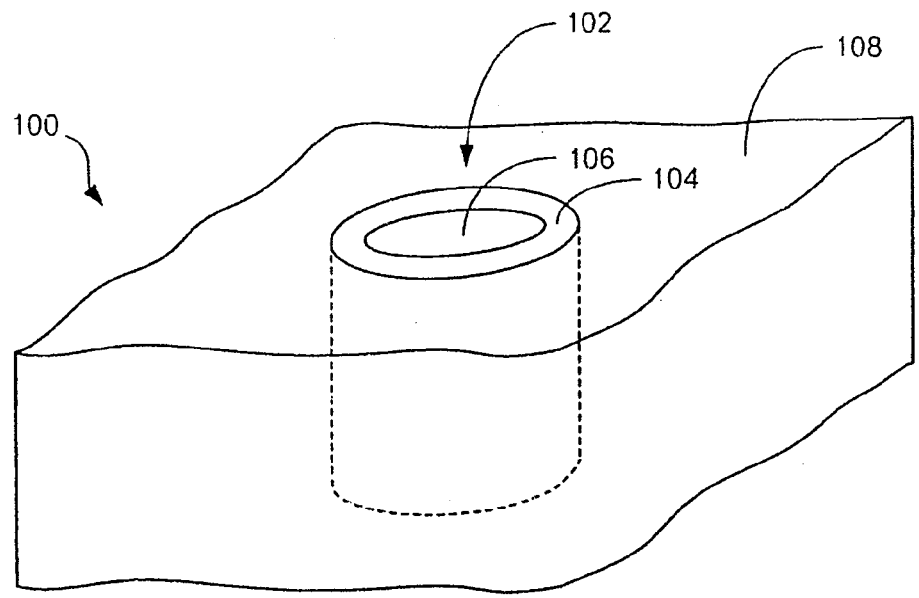
FIG. 1 is a schematic diagram depicting a prior art via structure.
Figure 2:
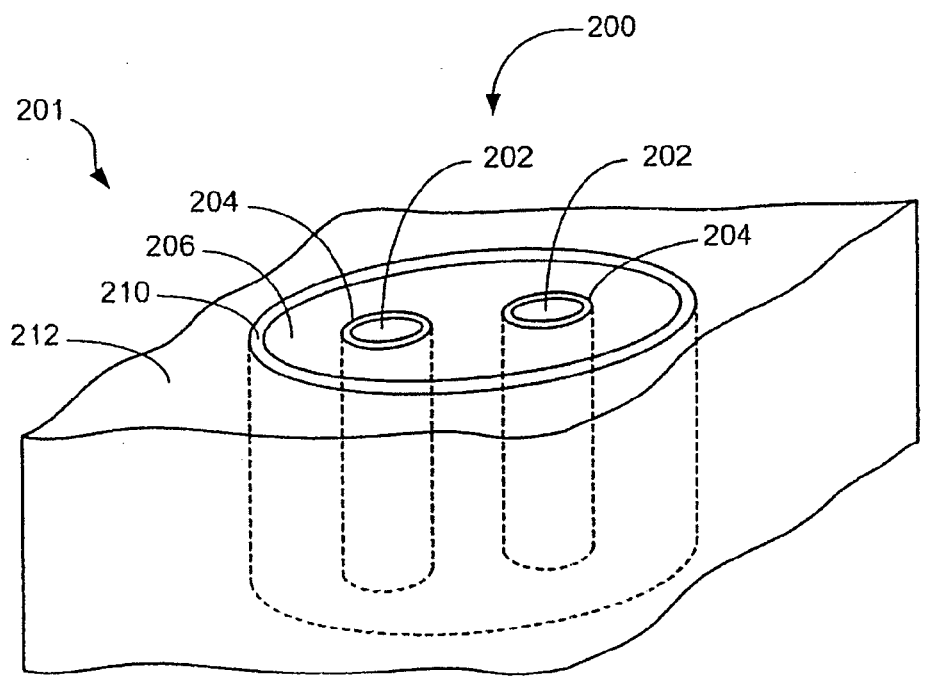
FIG. 2 is a schematic diagram depicting an embodiment of the via structure of the present invention.

Referring now to the drawings, wherein like reference numerals indicate corresponding parts through the several views, FIG. 2 schematically depicts an embodiment of a via structure 200 of the invention. In FIG. 2, via structure 200 is provided in wafer 201 and includes one or more conductors 202. More specifically, the embodiment of FIG. 2 depicts two such conductors. As described hereinafter, the conductors preferably are formed of substrate material, such as doped silicon.

An insulating layer 204 is provided about each conductor. The insulating layers can be formed of various materials, such as silicon dioxide, silicon nitride, polycrystalline silicon, or combinations thereof. Each insulating layer 204 forms a physical barrier between a conductor and substrate material 206 that surrounds the conductor.

Via structure 200 also includes an outer insulating layer 210 that is formed about the conductor(s). Outer insulating layer 210 can be formed of various materials, such as silicon dioxide, silicon nitride, polycrystalline silicon, or combinations thereof. The outer insulating layer 210 is adapted to electrically isolate the conductor(s) and/or substrate material 206, which is surrounded by the outer insulating layer, from substrate material 212 and/or components (not shown) arranged outside the outer insulating layer. So configured, each of the conductors can be adequately electrically isolated from an adjacent conductor as well as from material 212 and/or components arranged outside the outer insulating layer. In some embodiments, the conductors can be used to propagate signals between various wafers of a wafer assembly, such as a wafer stack. In other embodiments, conductors of the via structures can be used to propagate signals between components arranged at various depths of a single wafer.

Via structures of the invention, e.g., via structures 200, can be formed by creating trenches in a substrate. For instance, trenches can be formed by an etching process. After formation, the trenches are filled with insulating material, such as through deposition or growth, to define the insulating layers and outer insulating layers of the via structures. Since the trenches typically do not extend entirely through the substrate material, the via structures formed by the aforementioned process typically do not extend entirely through the substrate. In those applications where it is desirable for one or more of the via structures to extend entirely through the substrate, a portion of the substrate can be removed, such as by grinding or etching away a portion of the substrate material, to expose the previously buried end of the via structure.

Figure 3:
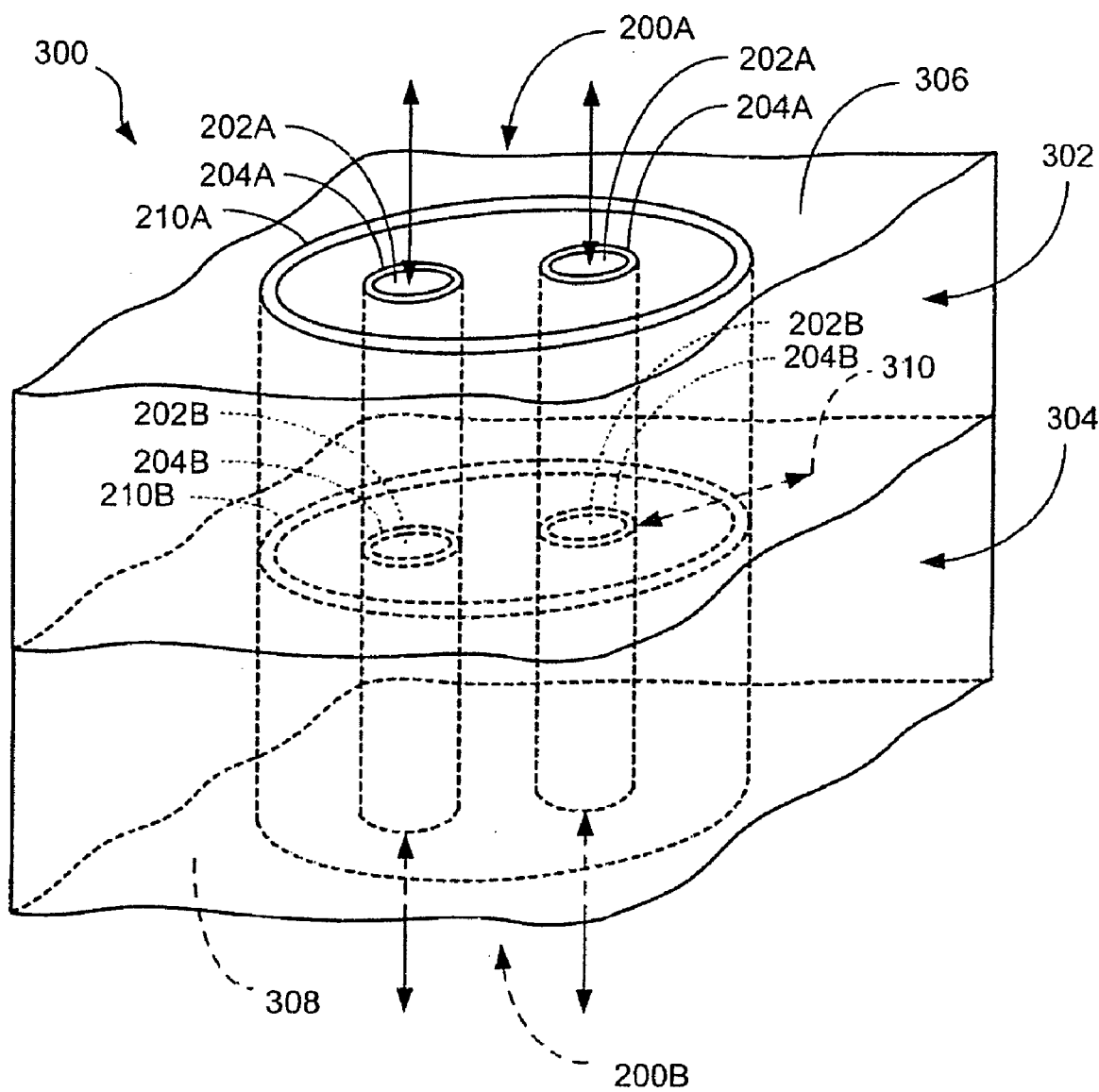
FIG. 3 is a schematic diagram depicting representative via structures shown formed as a portion of a wafer stack.

As mentioned hereinbefore, via structures 200 can be used to facilitate electrical communication between various locations of a wafer and/or wafer stack. For example, in FIG. 3, two via structures 200A, 200B are depicted in a wafer stack 300. In particular, via structure 200A is formed through wafer 302 and via structure 200B is formed through wafer 304. Via structure 200A includes two conductors 202A and their associated insulating layers 204A as well as an outer insulating layer 210A. Likewise, via structure 200B includes two conductors 202B and their associated insulating layers 204B as well as an outer insulating layer 210B. Each conductor 202A electrically communicates with a corresponding conductor 202B. So arranged, electrical signals can be propagated via the conductors to and/or from various locations of wafer stack 300. For example, electrical signals (represented by arrows) can be propagated between outer surfaces 306 and 308, and/or between an outer surface of the wafer stack and a location, e.g., location 310, defined between the wafers.

It should be noted that wafer stacks depicted herein, e.g., wafer stack 300 (FIG. 3) although including only two wafers, could be provided in various configurations and could incorporate various numbers of wafers other than those shown. All such configurations and numbers of wafers are considered well within the scope of the present invention.

Figure 4:
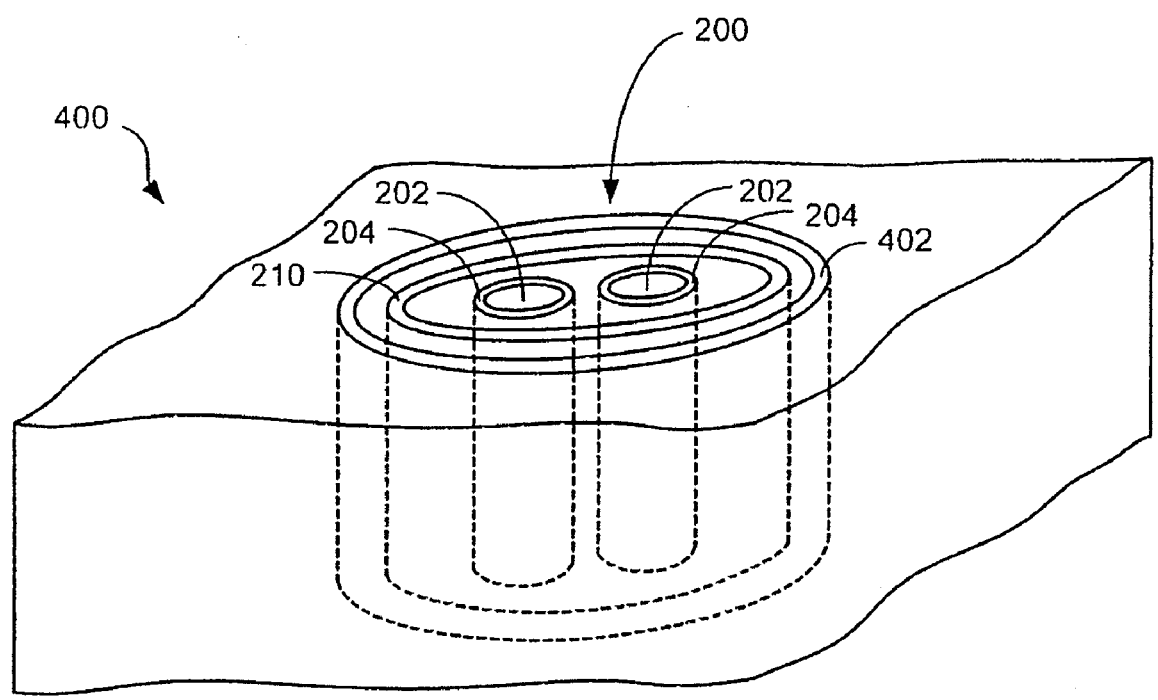
FIG. 4 is a schematic diagram depicting an embodiment of the via structure of the .present invention

As depicted in FIG. 4, embodiments of the via structure 200 can include multiple outer insulating layers. More specifically, the embodiment of FIG. 4, which is formed in a wafer 400, includes a first outer insulating layer 210 and a second outer insulating layer 402. This particular configuration offers the advantage of enabling the application of a higher electrical potential between the conductor(s) and the material of the substrate arranged outside the second outer insulating layer without resulting in breakdown.

Figure 5:
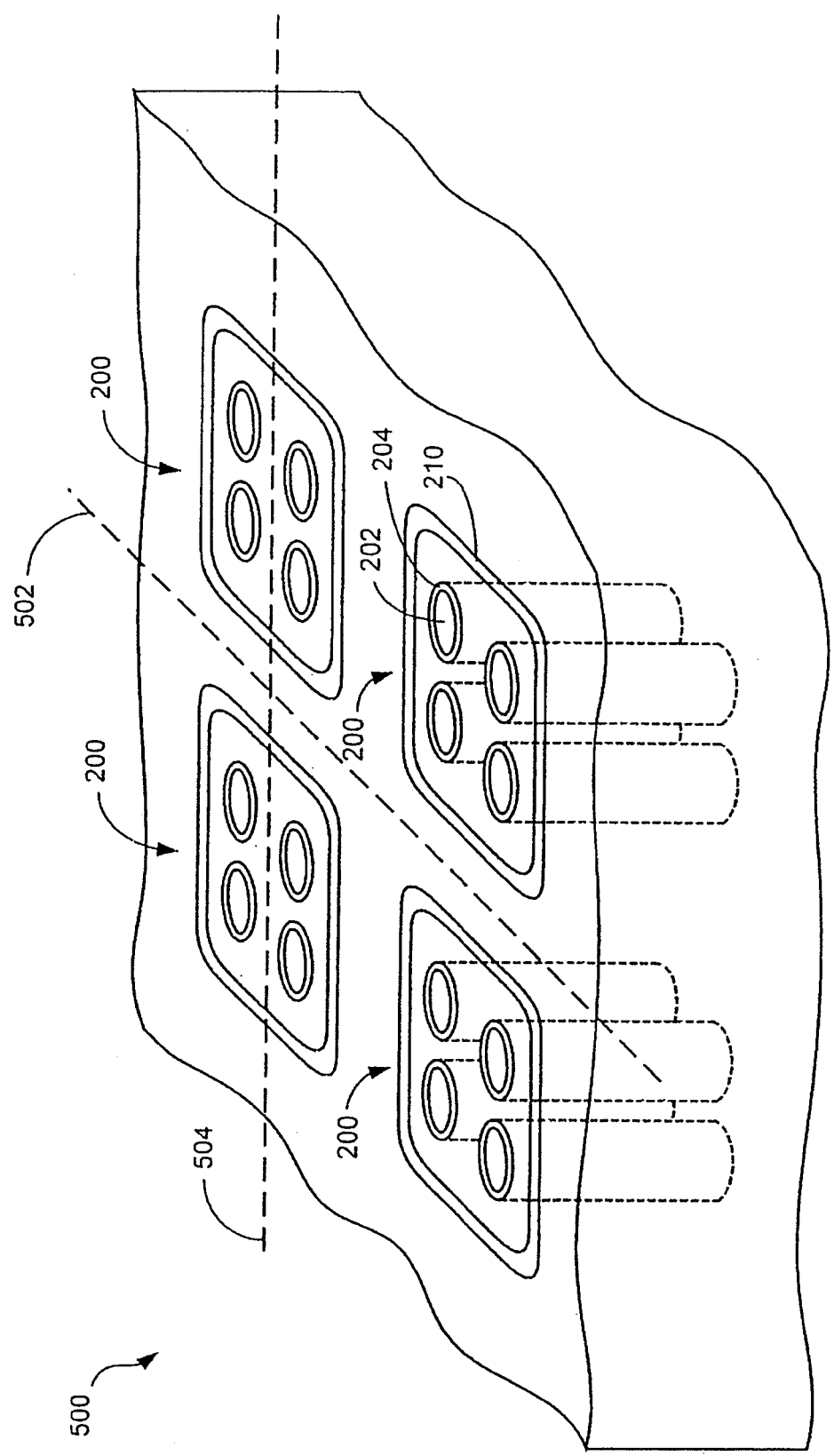
FIG. 5 is a schematic diagram depicting a portion of a wafer that includes multiple via structures.

Reference will now be made to the schematic diagram of FIG. 5 which depicts an array of via structures formed in a wafer 500. As shown in FIG. 5, each via structure 200 includes at least one conductor 202. In particular, each via structure of FIG. 5 includes four conductors 202. It should be noted, however, that various other numbers and arrangements of conductors can be used. As described in detail hereinbefore, an insulating layer 204 is formed about each conductor 202. Additionally, the conductors and associated insulating layers of each high voltage via structure 200 are surrounded by an outer insulating layer 210.

FIG. 5 also depicts dicing locations 502 and 504 where wafer 500 is to be diced. For example, wafer 500 can be diced by through-cutting or etching the material of the wafer. In FIG. 5, dicing location 502 is arranged between adjacent via structures 200, whereas dicing location 504 is arranged to divide a row of the via structures by separating each high voltage via structure into multiple via assemblies, which are described in detail hereinafter.

Figure 6:
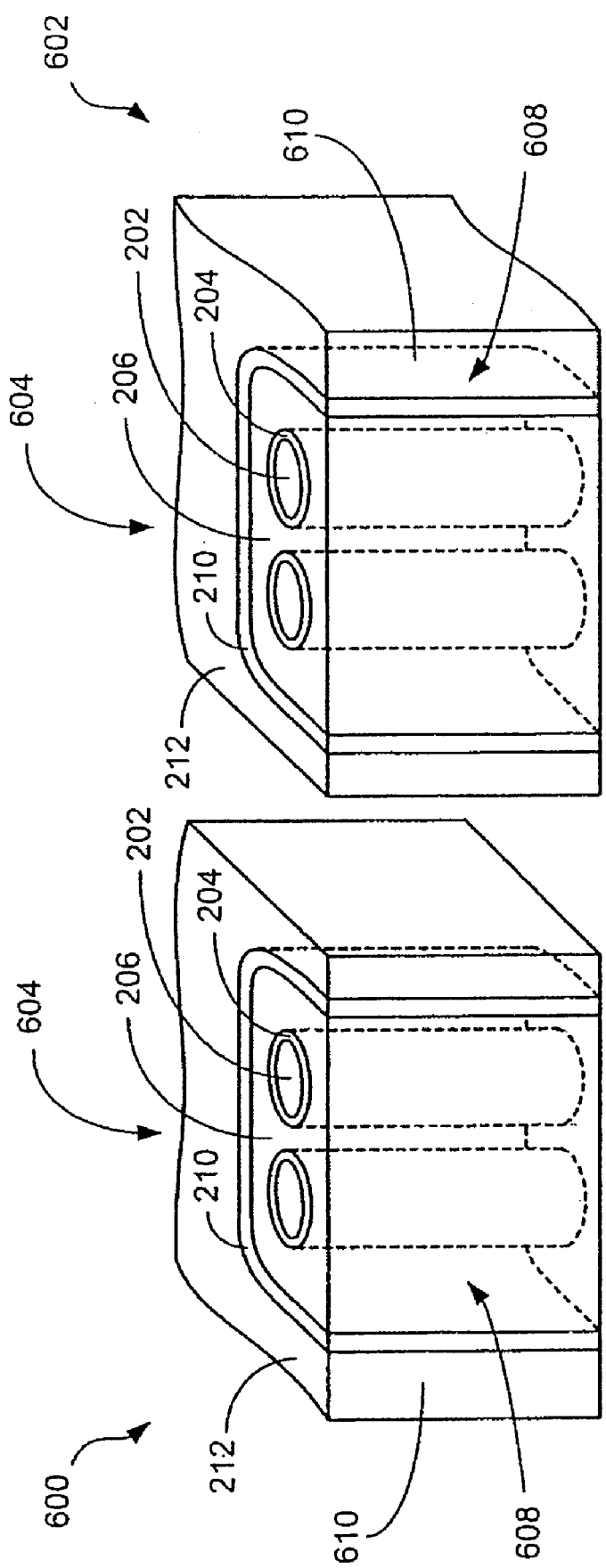
FIG. 6 is a schematic diagram depicting representative portions of the wafer of FIG. 5 shown after a dicing procedure.

As shown in FIG. 6, various die assemblies can be formed by dicing wafer 500 (FIG. 5) along the dicing locations. Representative portions of two such die assemblies, i.e. die assemblies 600 and 602, are depicted in FIG. 6. In FIG. 6, each of the die assemblies includes a via assembly 604. Each via assembly 604 includes at least one conductor 202 and its associated insulating layer 204, a portion of an outer insulating layer 210, and material 206 of the wafer that is electrically isolated from other material 212 of the wafer. Since each via assembly abuts an outer edge, e.g., sidewall 610, of its wafer, electrical isolation of signals propagated through a conductor(s) of the high voltage via assembly is at least partially facilitated by an air gap 608. Thus, in FIG. 7, each conductor 202 is electrically isolated from material 212 of the substrate by at least one insulating layer 204, material 206 which at least partially surrounds the conductor, at least a portion of at least one outer insulating layer 210, and an air gap 608.

Figure 7:
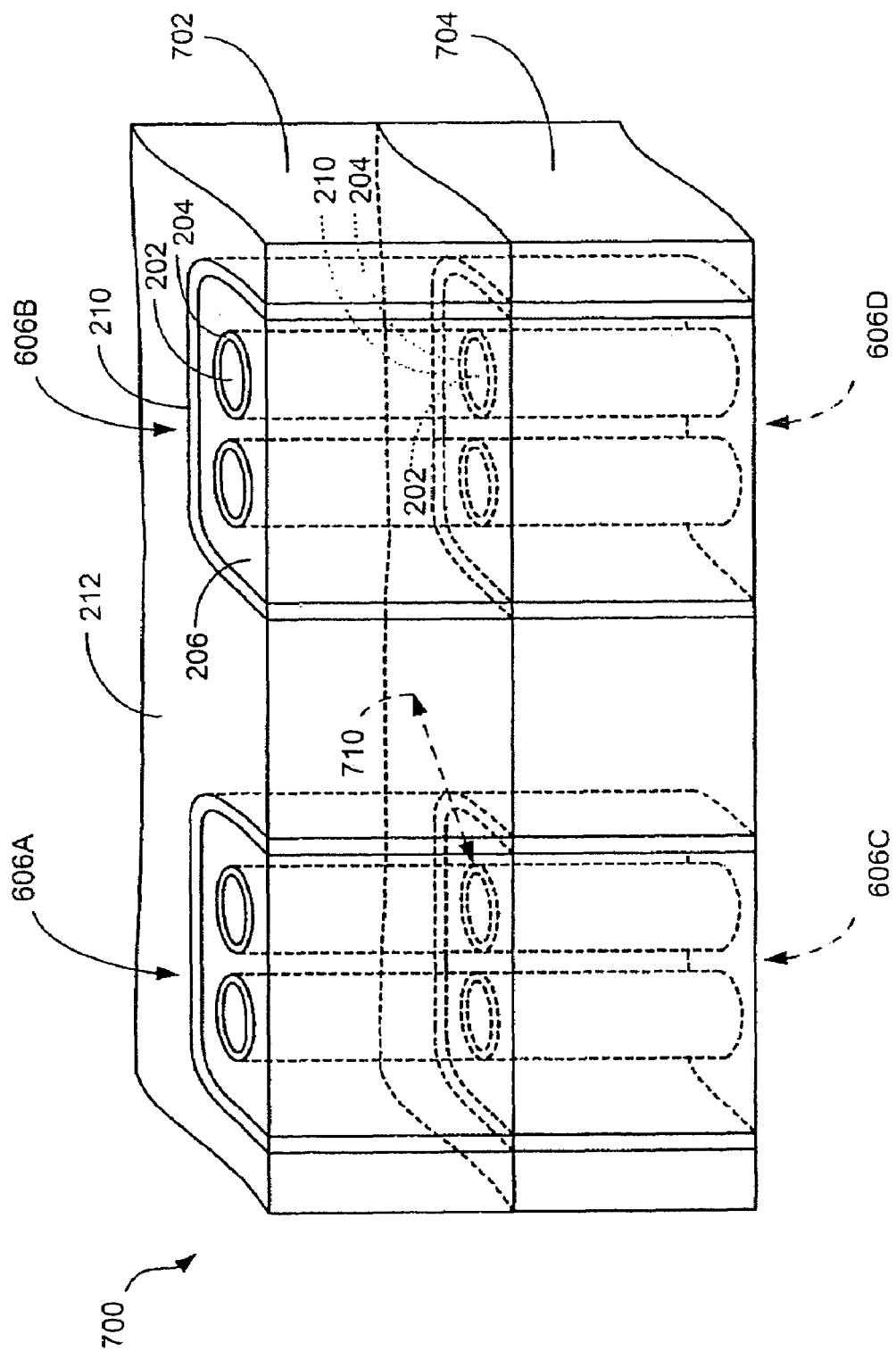
FIG. 7 is a schematic diagram depicting representative portions of the wafer of FIGS. 5 and 6 shown formed as a portion of a wafer stack.

In FIG. 7, it is shown that via assemblies 606 can be used to facilitate communication of components arranged at various locations of a wafer stack. More specifically, two via assemblies 606A, 606B of a wafer 702 and two via assemblies 606C, 606D of a wafer 704 are depicted in a wafer stack 700. Each of the via assemblies includes two conductors and their associated insulating layers as well as a portion of an outer insulating layer. Each conductor electrically communicates with a corresponding conductor of the other wafer. So arranged, electrical signals can be propagated via the conductors to and/or from various locations of wafer stack 700. For example, electrical signals (represented by arrows) can be propagated between outer surfaces 706 and 708, and/or between an outer surface of the wafer stack and a location, e.g., location 710, defined between the wafers.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

The invention claimed is:

1. A method for electrically isolating a portion of a wafer comprising:
   providing a first wafer;
   forming a first conductor at least partially through the first wafer;
   disposing first dielectric material between the first conductor and material of the first wafer;
   at least partially surrounding the first conductor and the first dielectric material with second dielectric material, the second dielectric material being spaced from the first dielectric material such that a first portion of the material of the first wafer is arranged between the first dielectric material and the second dielectric material and a second portion of the material of the first wafer is arranged outside an outer periphery of the second dielectric material; and
   at least partially surrounding the second dielectric material with third dielectric material, the third dielectric material being spaced from the second dielectric material.

2. The method of claim 1, further comprising:
   dicing the first wafer to form a first die assembly and a second die assembly, the first die assembly including the first conductor, the first dielectric material and a first portion of the second dielectric material, the second die assembly including the second conductor and a second portion of the second dielectric material.

3. The method of claim 1, further comprising:
   providing a second wafer; and
   locating the second wafer such that the first conductor provides electrical communication between the first wafer and the second wafer.

4. The method of claim 3, wherein:
   the second wafer comprises:
      a via structure adapted to provide electrical communication through the second wafer, the via structure comprising:
         first and second conductors having insulating layers to form a barrier with the substrate; and
         a first outer insulating layer formed about both the first and second conductors to electrically isolate the first and second conductors from the substrate material; and
      the method additionally comprises:
         arranging the second wafer in an overlying relationship with the first wafer to form wafer stack.

5. The method of claim 4, further comprising:
   propagating signals between the first wafer and the second wafer using the via structures.

6. The method of claim 5, wherein the signals are selected from the group consisting of power signals and data signals.

7. The method of claim 4, further comprising:
   propagating signals among various locations within the second wafer using the via structure of the second wafer.

8. A method for electrically isolating a portion of a wafer comprising:
   providing a first wafer;
   forming a first conductor at least partially through the first wafer;
   disposing first dielectric material between the first conductor and material of the first wafer; and
   at least partially surrounding the first conductor and the first dielectric material with second dielectric material, the second dielectric material being spaced from the first dielectric material such that a first portion of the material of the first wafer is arranged between the first dielectric material and the second dielectric material and a second portion of the material of the first wafer is arranged outside an outer periphery of the second dielectric material,
   providing a second wafer;
   forming a first conductor at least partially through the second wafer;
   disposing first dielectric material between the first conductor and material of the second wafer; and
   at least partially surrounding the first conductor and the first dielectric material of the second wafer with second dielectric material, the second dielectric material of the second wafer being spaced from the first dielectric material of the second wafer such that a first portion of the material of the second wafer is arranged between the first dielectric material and the second dielectric material of the second wafer and a second portion of the material of the second wafer is arranged outside an outer periphery of the second dielectric material of the second wafer; and
   arranging the second wafer and the first wafer such that the first conductor of the first wafer and the first conductor of the second wafer electrically communicate with each other;
   wherein the first wafer has a first side and an opposing second side, and the first conductor extends through the first wafer from the first side to the second side, and further comprising:
   forming a second conductor through the first wafer from the first side to the second side, the second conductor being arranged between the first dielectric material and the second dielectric material;
   wherein the second wafer has a first side and an opposing second side, and the first conductor of the second wafer extends through the second wafer from the first side to the second side, and further comprising:
   forming a second conductor through the second wafer from the first side to the second side, the second conductor of the second wafer being arranged between the first dielectric material and the second dielectric material of the second wafer; and
   wherein the first wafer includes a second conductor formed through the first wafer from the first side to the second side, the second conductor of the first wafer being arranged between the first dielectric material and the second dielectric material of the first wafer, and the first wafer and the second wafer are bonded together to form a wafer stack, and further comprising:
   dicing the wafer stack to form a first die assembly and a second die assembly,
   the first die assembly including the first conductor of the first wafer, the first dielectric material of the first wafer, the first conductor of the second wafer, the first dielectric material of the second wafer, a first portion of the second dielectric material of the first wafer, and a first portion of the second dielectric material of the second wafer,
   the second die assembly including the second conductor of the first wafer, the second conductor of the second wafer, a second portion of the second dielectric material of the first wafer, and a second portion of the second dielectric material of the second wafer.

9. A method for electrically isolating a portion of a wafer comprising:

providing a first wafer having a first side and an opposing second side;

forming a first conductor through the first wafer from the first side to the second side;

forming a first conductor insulating layer through the first wafer, the first conductor insulating layer engaging the first conductor and being located between the first conductor and material of the first wafer, the first conductor insulating layer being formed of dielectric material; and forming a first outer insulating layer through the first wafer from the first side to the second side and spaced from the first conductor insulating layer such that the first outer insulating layer at least partially electrically isolates the first conductor from portions of the first wafer located outside the first outer insulating layer, the first outer insulating layer being formed of dielectric material; and forming a second outer insulating layer through the first wafer from the first side to the second side and spaced from the first outer insulating layer such that the first outer insulating layer is arranged between the second outer insulating layer and the first conductor insulating layer, the second outer insulating layer being formed of dielectric material.

10. The method of claim 9, further comprising:

forming a second conductor, the second conductor extending at least partially through the first wafer, the second conductor being arranged within an area at least partially bounded by the first outer insulating layer.

11. The method of claim 9, further comprising:
propagating a power signal via the first conductor.

12. The method of claim 9, further comprising:
propagating a data signal via the first conductor.

13. The method of claim 9, further comprising:
providing a second wafer at least partially overlying the first wafer, the second wafer having a third conductor; and propagating a signal from the first conductor of the first wafer to the third conductor of the second wafer.

14. The method of claim 13, wherein:

the second wafer comprises:

a first conductor insulating layer formed at least partially through the second wafer, the first conductor insulating layer of the second wafer engaging the first conductor of the second wafer and being disposed between the first conductor of the second wafer and material of the second wafer, the first conductor insulating layer of the second wafer being formed of dielectric material; and a first outer insulating layer formed at least partially through the second wafer and spaced from the first conductor insulating layer of the second wafer, the first outer insulating layer of the second wafer being formed of dielectric material.

* * * * *